US007962681B2

(12) United States Patent
Rao et al.

(10) Patent No.: US 7,962,681 B2
(45) Date of Patent: Jun. 14, 2011

(54) SYSTEM AND METHOD OF CONDITIONAL CONTROL OF LATCH CIRCUIT DEVICES

(75) Inventors: Hari Rao, San Diego, CA (US); Cheng Zhong, San Diego, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 747 days.

(21) Appl. No.: 11/971,353

(22) Filed: Jan. 9, 2008

(65) Prior Publication Data

US 2009/0174453 A1    Jul. 9, 2009

(51) Int. Cl.
*G06F 13/00* (2006.01)
*H03K 3/00* (2006.01)
(52) U.S. Cl. ........................ 710/300; 327/217
(58) Field of Classification Search .......... 710/300; 327/217
See application file for complete search history.

(56) References Cited

U.S. PATENT DOCUMENTS

| | | | |
|---|---|---|---|
| 3,976,949 A * | 8/1976 | Hepworth et al. ............ 327/217 |
| 4,045,693 A * | 8/1977 | Ester ............................ 327/217 |
| 4,580,137 A | 4/1986 | Fiedler et al. |
| 4,806,786 A * | 2/1989 | Valentine ..................... 327/203 |
| 4,894,557 A | 1/1990 | Beltramini |
| 4,933,575 A * | 6/1990 | Aso .............................. 326/46 |
| 5,519,346 A * | 5/1996 | Haddad et al. ............... 327/143 |
| 5,604,755 A * | 2/1997 | Bertin et al. ................. 714/799 |
| 5,625,309 A * | 4/1997 | Fucili et al. .................. 327/217 |
| 6,704,865 B1 * | 3/2004 | Duff ............................ 713/2 |
| 6,903,616 B2 * | 6/2005 | Yin et al. ..................... 331/57 |
| 6,981,169 B2 | 12/2005 | Chandran et al. |
| 7,263,022 B2 | 8/2007 | Imondi |
| 7,265,457 B2 | 9/2007 | Yasui et al. |
| 7,268,713 B2 | 9/2007 | Suzuki et al. |
| 7,672,190 B1 * | 3/2010 | Raza et al. ............ 365/230.08 |
| 2004/0041602 A1 * | 3/2004 | Kawakubo .................... 327/143 |
| 2007/0189071 A1 | 8/2007 | Vali et al. |

FOREIGN PATENT DOCUMENTS

| | | |
|---|---|---|
| EP | 0685938 | 12/1995 |
| WO | 9621272 | 7/1996 |

OTHER PUBLICATIONS

Cecilia Metra et al, Concurrent Detection of Power supply Noise, IEEE Transaction on Reliability vol. 52, No. 4, Dec. 2003.*
International Search Report-PCT/US09/030521, International Search Authority-European Patent Office May 20, 2009.
Written Opinion-PCT/US09/030521, International Search Authority-European Patent Office-May 20, 2009.
Seongmoo Heo, Ronny Krashinsky, and Krste Asanovic; Activity-Sensitive Flip-Flop and Latch Selection for Reduced Energy; 19th Conference on Advanced Research in VLSI, Salt Lake City, UT, Mar. 2001; pp. 1-17.
Albert Ma and Krste Asanovic; A Double-Pulsed Set-Conditional-Reset Flip-Flop; pp. 1-4.

* cited by examiner

*Primary Examiner* — Mark Rinehart
*Assistant Examiner* — Christopher A Daley
(74) *Attorney, Agent, or Firm* — Sam Talpalatsky; Nicholas J. Pauley; Jonathan Velasco

(57) ABSTRACT

A circuit device includes a first input to receive a reset control signal and a second input coupled to an output of a latch. The circuit device also includes a logic circuit adapted to conditionally reset the latch based on a state of the output in response to receiving the reset control signal.

25 Claims, 5 Drawing Sheets

US 7,962,681 B2

SYSTEM AND METHOD OF CONDITIONAL CONTROL OF LATCH CIRCUIT DEVICES

I. FIELD

The present disclosure is generally related to a system and method of conditional control of latch circuit devices.

II. DESCRIPTION OF RELATED ART

In general, sequential circuit elements, such as synchronous and asynchronous latch and flip-flop type logical storage elements, represent fundamental building blocks of circuit devices. A latch may include a pair of inverters that are cross-coupled to create a bi-stable device that can store a value representing a zero or a one. By coupling other logic gates, such as inverters, NAND gates and OR gates, to the latch, more complex logic circuits may be created.

Such storage elements may be used alone or in arrays of storage elements at a variety of locations within a circuit. For example, such storage elements may be used in a circuit to temporarily store data bits, such as data bits received at an interface or at the input or output of an execution stage within a processor. Before a subsequent process executes, it is often desirable to reset the storage element to a known state prior to a subsequent operation. For storage elements at an output of an execution unit of a processor, it may be desirable to reset each storage element before every execution cycle. Such a reset operation may include asserting a logic high voltage level at a reset input of the storage element.

Unfortunately, the assertion of the logic high voltage level (i.e., reset signal) results in undesired power dissipation, which may result from parasitic capacitances due to wire traces and switching transistors. Hence, there is a need for improved latch reset circuitry.

III. SUMMARY

In a particular embodiment, a circuit device is disclosed that includes a first input to receive a reset control signal and a second input responsive to an output of a latch. The circuit device further includes a logic circuit adapted to conditionally reset the latch based on the second input in response to receiving the reset control signal at the first input.

In another particular embodiment, a method is disclosed that includes receiving a reset signal indicating a reset operation for a plurality of latches and detecting a state value associated with each of the plurality of latches. The method also includes, in response to the reset signal, selectively resetting some, but not all, of the plurality of latches based on the detected state values.

In still another particular embodiment, a circuit device is disclosed that includes a plurality of latch circuits adapted to store data. Each of the plurality of latch circuits includes a latch output. The circuit device further includes a plurality of feedback paths. Each of the plurality of feedback paths is coupled to a respective latch output associated with a respective one of the plurality of latch circuits. The circuit device also includes a logic circuit responsive to each of the plurality of feedback paths. The logic circuit is adapted to selectively reset one or more of the plurality of latch circuits responsive to values provided by the plurality of feedback paths.

In yet another particular embodiment, a communications device is disclosed that includes a digital signal processor and a volatile memory coupled to the digital signal processor and including a plurality of latch circuit devices. The communications device further includes a reset logic circuit coupled to the volatile memory and responsive to feedback from the plurality of latch circuit devices to selectively reset some, but not all, of the latch circuit devices.

One particular advantage provided by embodiments of a conditional reset logic circuit to selectively reset latches based on their respective output state values is provided in that overall power consumption is reduced. Additionally, since each reset operation may introduce a surge current event at a power supply circuit, reducing a number of reset operations can result in an overall reduction in power surge current events.

Another particular advantage is provided in that the reduced power consumption can allow for longer battery life for portable devices. Alternatively, the reduced power consumption allows a manufacturer to utilize a cheaper (i.e., shorter life) battery without degradation of the overall portability of the device.

Still another particular advantage is provided in that cross-coupling noise is reduced. By conditionally resetting each of the latches, adjacent latches are not necessarily reset at the same time. Accordingly, cross-coupling noise can be reduced and a number of decoupling capacitors may also be reduced.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
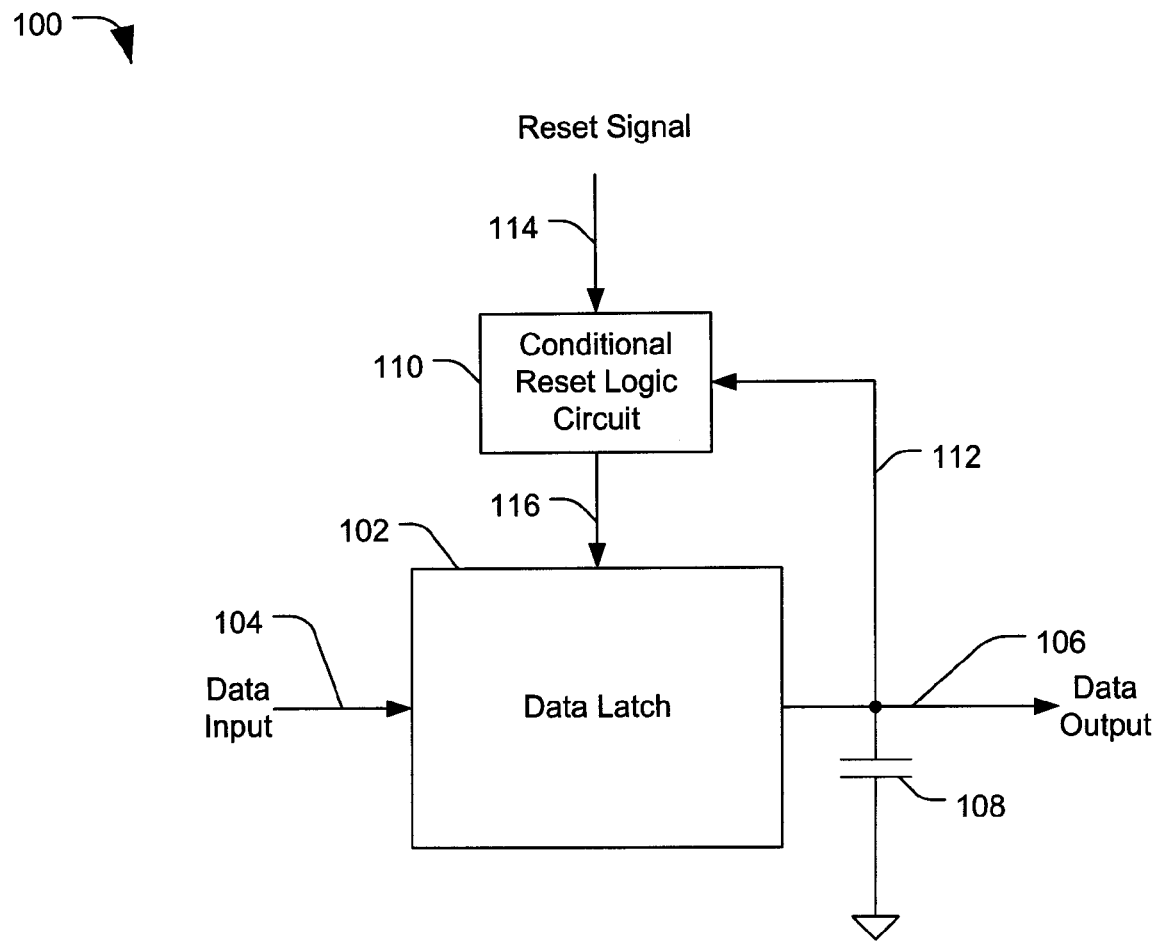
FIG. 1 is a block diagram of an embodiment of a circuit device including conditional reset logic circuitry to conditionally reset a latch circuit.

Referring to FIG. 1, a circuit device 100 is depicted that includes a data latch 102 and a conditional reset logic circuit 110. The data latch 102 has a data latch input 104 and provides a data output 106. In a particular embodiment, the data latch 102 comprises an asynchronous latch device. The data latch 102 receives a second input 116 from the conditional reset logic circuit 110. The conditional reset logic circuit 110 has a first input to receive a reset control signal 114 and a second input to receive a feedback signal from a feedback path 112, which is coupled to the data output 106. The data output 106 is coupled to a voltage source via capacitor 108 to hold a data value at the data output 106.

In a particular embodiment, the conditional reset logic circuit 110 is adapted to conditionally reset the data latch 102 based on the reset control signal 114 and based on a data value at the data output 106 of the data latch 102, which is received at the second input of the conditional reset logic circuit 110 via the feedback path 112. The conditional reset logic circuit 110 is configured to conditionally reset the data latch 102 in response to receiving the reset control signal 114 when a value at the data output 106 represents a non-reset value. In a particular embodiment, the conditional reset logic circuit 110 resets the data latch 102 when a state of the data output 106 represents logical "1" value (i.e., a non-reset value), and does not reset the data latch 102 when the state of the data output 106 represents a logical "0" value (i.e., a reset value). It will be understood that the terms 'logical "0"' and 'logical "1"' are used to distinguish between logical signal values, and may represent various voltage levels or signal characteristics, as may be determined by particular implementations of the systems and methods disclosed herein.

Since the data latch 102 is conditionally reset by the logic circuit 110 only when a data value at the data output 106 represents a non-reset value, such as a logic high data value (e.g., a logical "1" data value), power consumption due to data latching reset activity of the data latch 102 is reduced. In a circuit device that includes multiple latch circuits responsive to conditional reset logic, power consumption for one or more data latch elements is reduced, reducing overall power consumption. In addition, cross-coupling noise and power supply noise may also be reduced.

Figure 2:
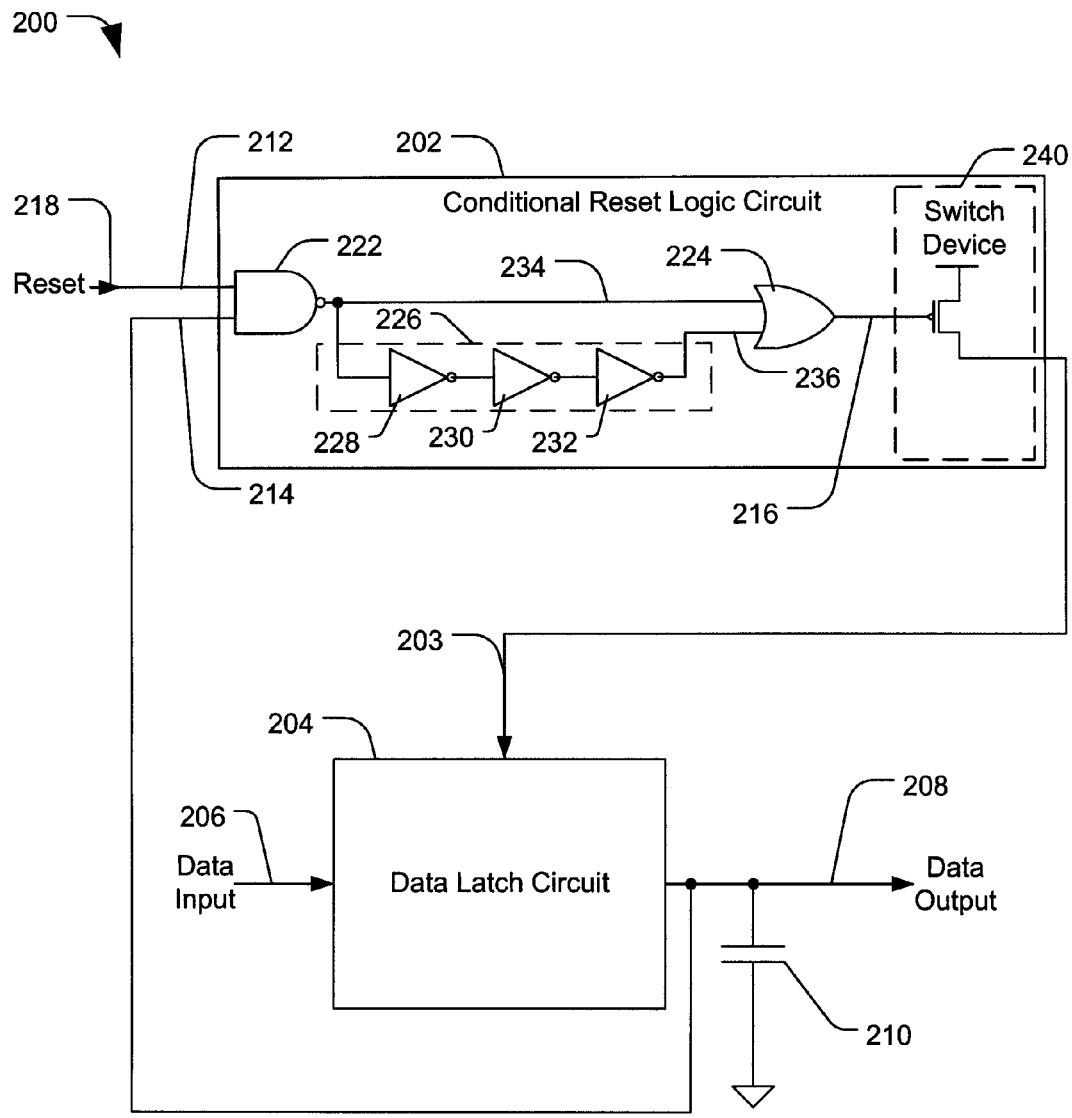
FIG. 2 is a diagram of an embodiment of a system including conditional reset logic circuitry to conditionally reset a latch circuit.

Referring to FIG. 2, a particular embodiment of a system 200 is shown that includes conditional reset logic circuitry to conditionally reset a latch circuit. The system 200 includes a representative data latch circuit 204, which has a data input 206 and a data output 208. The system 200 includes a capacitor 210 coupled to the data output 208 to hold a value at the data output 208. The system 200 further includes a conditional reset logic circuit 202 having a first input 212 and a second input 214. The conditional reset logic circuit 202 is responsive to a reset signal 218 received at the first input 212, and is further responsive to the data output 208 of the data latch circuit 204 received at the second input 214, to conditionally reset the data latch 204 based on a data value at the data output 208.

In a particular embodiment, a control output 216 is coupled to the input 203 via a switch device 240, such as via a transistor that is configured to couple the input 203 to a supply voltage in response to a signal received at a gate terminal via the control output 216. In another particular embodiment, the switch device 240 may not be included in the conditional reset logic circuit 202, and may instead be configured as a separate control device, as a part of the data latch circuit 204, as a part of one or more other control circuits (not shown), or any combination thereof.

In a particular embodiment, the conditional reset logic circuit 202 includes a logical NAND gate 222, a logical OR gate 224, and a delay circuit 226 that includes a plurality of invertors 228, 230, and 232 arranged in series. The logical OR gate 224 receives an output 234 from the logical NAND gate 222 at a first input and receives an output 236 of the delay circuit 226 at a second input. The logical NAND gate 222 is coupled to receive the first input 212 that is responsive to the reset control signal 218 and is further coupled to receive the second input 214 that is responsive to the data output 208 of the data latch circuit 204.

In a particular illustrative embodiment, during a non-reset stage, a value of a reset control signal 218 at the first input 212 is at a logical "0" level. A corresponding value at the output 234 of the logical NAND gate 222 is a logical "1" value. The first inverter 228 inverts the logical "1" value to a logical "0" value. The second inverter 230 inverts the logical "0" value to a logical "1" value, and the third inverter 232 inverts the logical "1" value to a logical "0" value. The logical OR gate 224 receives the logical "1" value from the output 234 of the NAND gate 222 and also receives the logical "0" value from the output 236 of the delay circuit 226, resulting in the control output 216 having a logical "1" value. When the reset signal 218 changes to a logical "1" value at the first input 212, a value at the output 234 of the NAND gate 222 changes only if the second input 214 also has a logical "1" value (i.e., a value at the data output 208 of the data latch circuit 204 is also at a logical "1" value). If a data value at the data output 208 is at a logical "0" level, the output 234 of the logical NAND gate 222 remains at a logical "1" level and the control output 216 of the logical OR gate 224 remains at a logical "1" value.

When the data value at the data output 208 is at a logical "1" level when the reset signal 218 is asserted at the first input 212 of the conditional reset logic circuit 202, the data value at the output 234 of the logical NAND gate 222 changes to a logical "0" value and a value at the output 236 of the delay circuit 226 remains temporarily at a logical "0" value. Thus, the control output 216 of the logical OR gate 224 changes temporarily to a logical "0" level. The logical "0" value at the output 234 of the NAND gate 222 is inverted by the first inverter 228 to a logical "1" level. The second inverter 230 inverts the logical "1" to a logical "0", and the third inverter 232 inverts the logical "0" to a logical "1". Each of the inverters 228, 230, and 232 introduces a gate delay. In this instance, after three gate delays, the third inverter 232 provides a logical "1" value to an input of the logical OR gate 224, and a voltage level at the control output 216 returns to a logical "1" voltage level.

When the data output 208 of the data latch circuit 204 is reset to a logical "0" value after receipt of the conditioned reset signal at the input 203, a logic value at the data output 208 is provided via a feedback path to the second input 214 of the NAND gate 222. The output 234 of the NAND gate 222 then becomes a logical "1" value and the control output 216 of the logical OR gate 224 is held at a logical "1" value.

Figure 3:
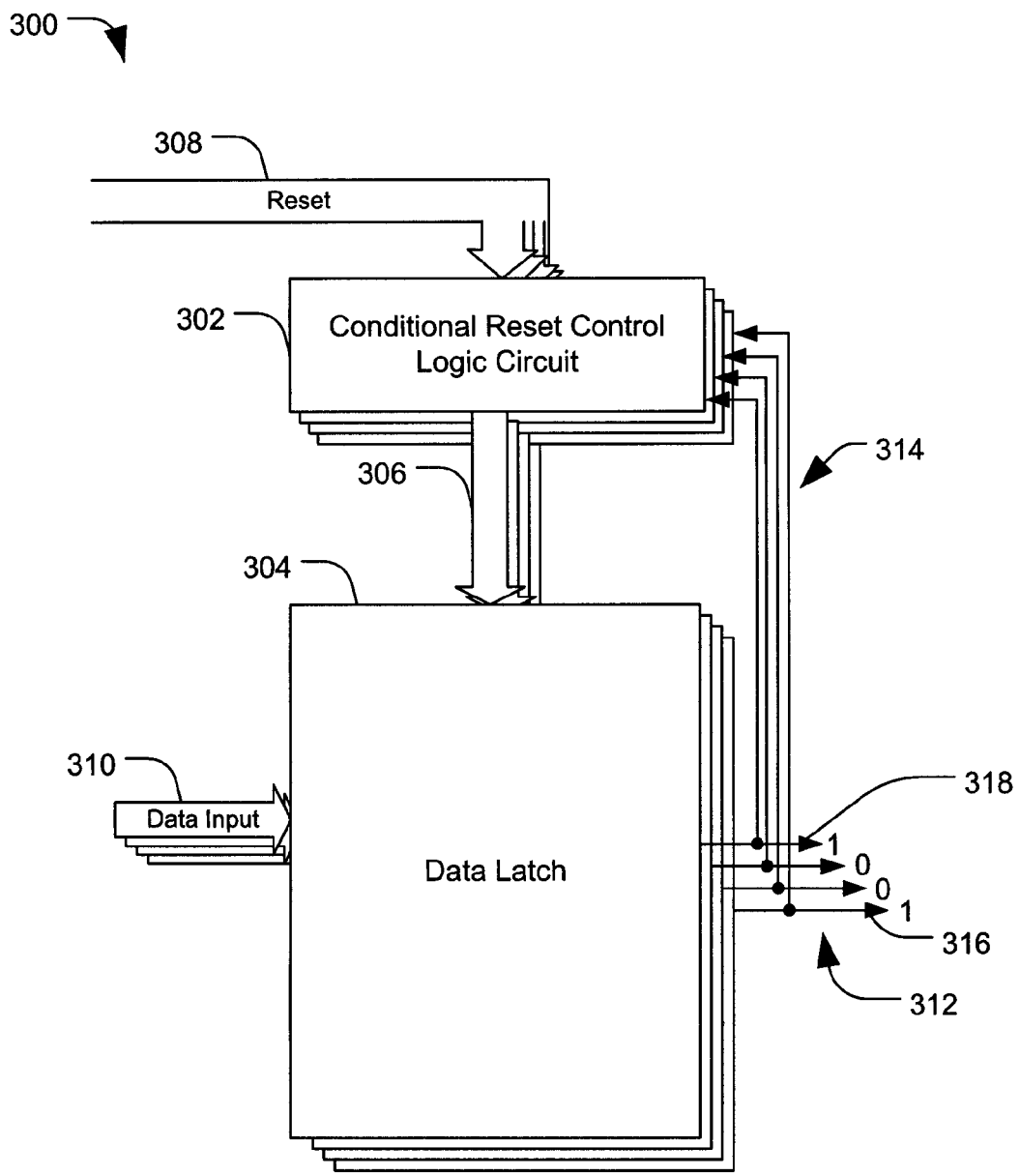
FIG. 3 is a diagram of an embodiment of a system including conditional reset control logic circuitry to conditionally reset a plurality of latch circuits.

Referring to FIG. 3, a system 300 that includes a circuit device including conditional reset control logic circuitry to conditionally reset a plurality of latch circuits is shown. The system 300 includes a plurality of data latch circuits 304 that are adapted to store data. Each of the data latch circuits 304 includes a data latch input and a latch output. Representative inputs and outputs of the data latch circuits 304 are generally indicated at 310 and 312, respectively. Individual latch outputs are represented at 316 and 318 in FIG. 3. The system 300 includes a plurality of feedback paths 314. Each of the plurality of feedback paths 314 is coupled to a respective latch output 312 that is associated with a respective one of the plurality of data latch circuits 304. The system 300 also includes conditional reset logic circuitry 302 that is responsive to each of the plurality of feedback paths 314 and includes an input responsive to one or more reset control signals 308. The conditional reset logic circuitry 302 is adapted to selectively reset one or more of the plurality of data latch circuits 304 in response to values provided by the plurality of feedback paths 314 and in response to the reset control signals 308.

In a particular embodiment, the conditional reset logic circuitry 302 includes a plurality of logic circuits where each of the plurality of logic circuits is coupled to a particular one of the reset control signals 308 and is also coupled to a corresponding latch circuit of the plurality of data latch circuits 304. Each logic circuit within the conditional reset logic circuitry 302 comprises a first input to receive the reset signal 308 and a second input that is coupled to a particular respective feedback path 314, which is coupled to a particular output of the data latch circuits 304, such as the output 316. In a particular embodiment, one or more of the logic circuits of the conditional reset logic circuits 302 may be implemented as the conditional reset logic circuit 202 shown in FIG. 2.

In a particular illustrative embodiment, the conditional reset logic circuitry 302 is adapted to selectively reset one or more of the data latch circuits 304 in response to receiving data values corresponding to the respective outputs 312 via the feedback paths 314. For example, the conditional reset logic circuit 302 is adapted to selectively reset a first output 316 and the second output 318 to a logical zero value in response to receiving the reset signal 308. Additionally, the conditional reset logic circuit 302 is adapted to prevent assertion of the reset signal 308 to reset data latch circuits 304 that already have a zero value at the respective output 312.

Figure 4:
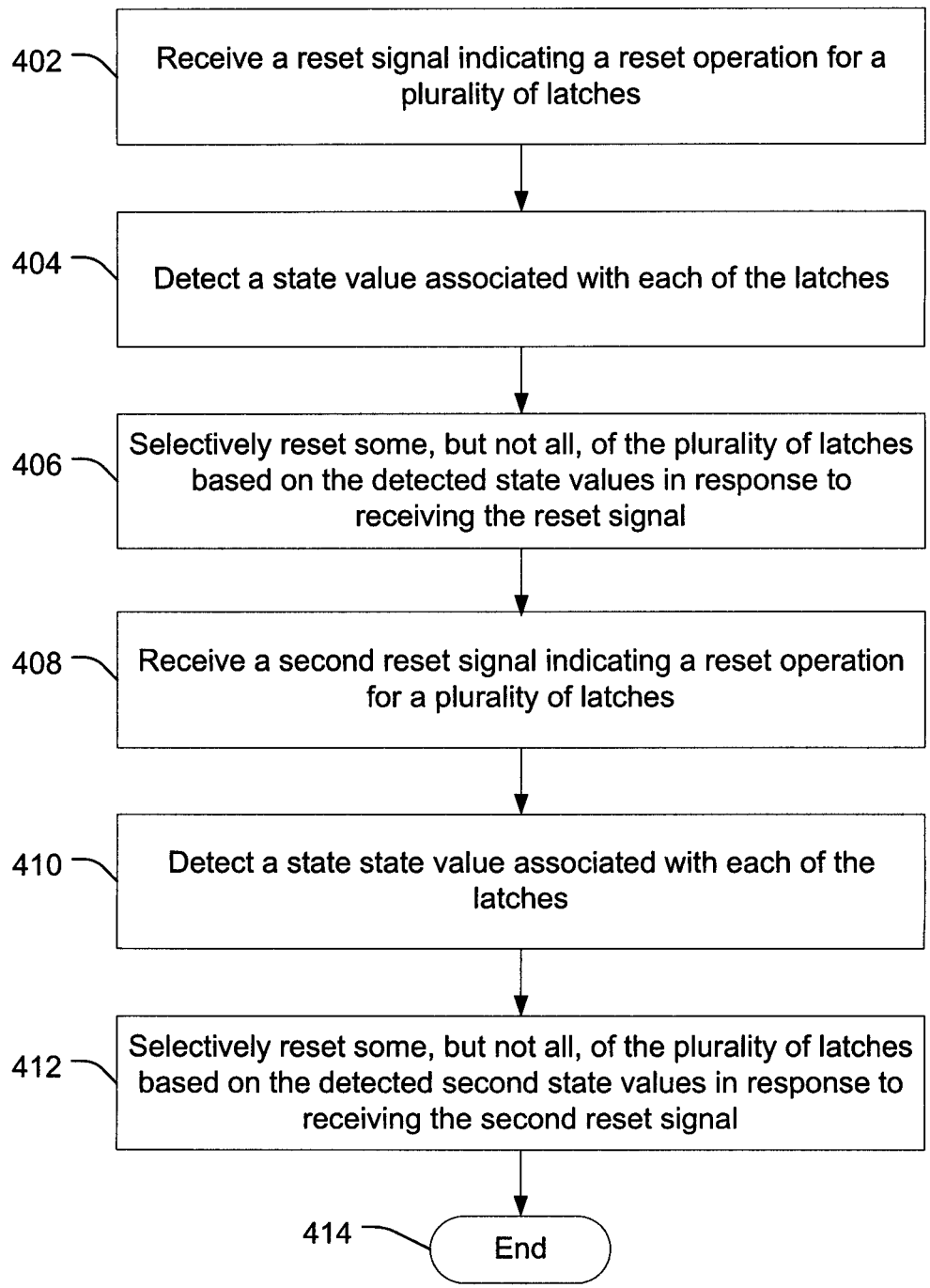
FIG. 4 is a flow diagram of a particular illustrative embodiment of a method of conditionally controlling data latch circuits.

Referring to FIG. 4, a method of conditionally controlling one or more data latch circuits is shown. In a particular embodiment, the method includes receiving a reset signal indicating a reset operation for a plurality of data latches, at 402, and detecting a state value associated with each of the plurality of data latches, as shown at 404. In a particular embodiment, the state value is the data output (e.g., logical "1" or logical "0" of each of the respective data latches). The method further includes selectively resetting some, but not all, of the plurality of latches based on the detected state values in response to receiving the reset signal, as shown at 406. In a particular embodiment, the latches that have a data output of a logical "1" value are reset and the latches that have data output of a logical "0" are not reset by conditional reset logic. In a particular embodiment, the conditional reset logic may be the conditional reset logic circuit 110 shown in FIG. 1, the conditional reset logic circuit 202 shown in FIG. 2, or the conditional reset logic circuitry 302 shown in FIG. 3.

In general, each of the plurality of latches may be coupled to a power supply and the conditional reset operation that includes selectively resetting some of the latches is associated with a reduction in corresponding power supply noise. For example, where some but not all of the latches are reset, only the reset latches contribute to the power supply noise. In this manner, the disclosed method reduces power consumption and reduces corresponding power supply noise at a power supply coupled to each of the plurality of data latches. Further, when some, but not all of the latches are reset, cross-coupling between adjacent latches may be reduced, thereby reducing power supply noise due to cross-coupling effects.

In a particular embodiment, each of the latches that are reset are provided an enable signal which conditionally resets the selected latch circuits. The latch circuits that are selected for conditional reset have an output value, such as a logical "1" value, that is a different value than a reset value (e.g., logical "0" value). While logical "1" and logical "0" have been described in this example, it should be understood that different values may be used to provide the conditional reset functionality.

In a particular embodiment, the method further includes receiving a second reset signal at 408 and detecting a second state value associated with each of a plurality of latches, as shown at 410. In response to receiving the second reset signal, the method includes selectively resetting some, but not all, of the plurality of latches based on the detected second state values, as shown at 412. The set of latches selected in response to the second reset signal may be the same as or different than the set of latches selected for the initial reset signal. The method terminates as shown at 414.

Figure 5:
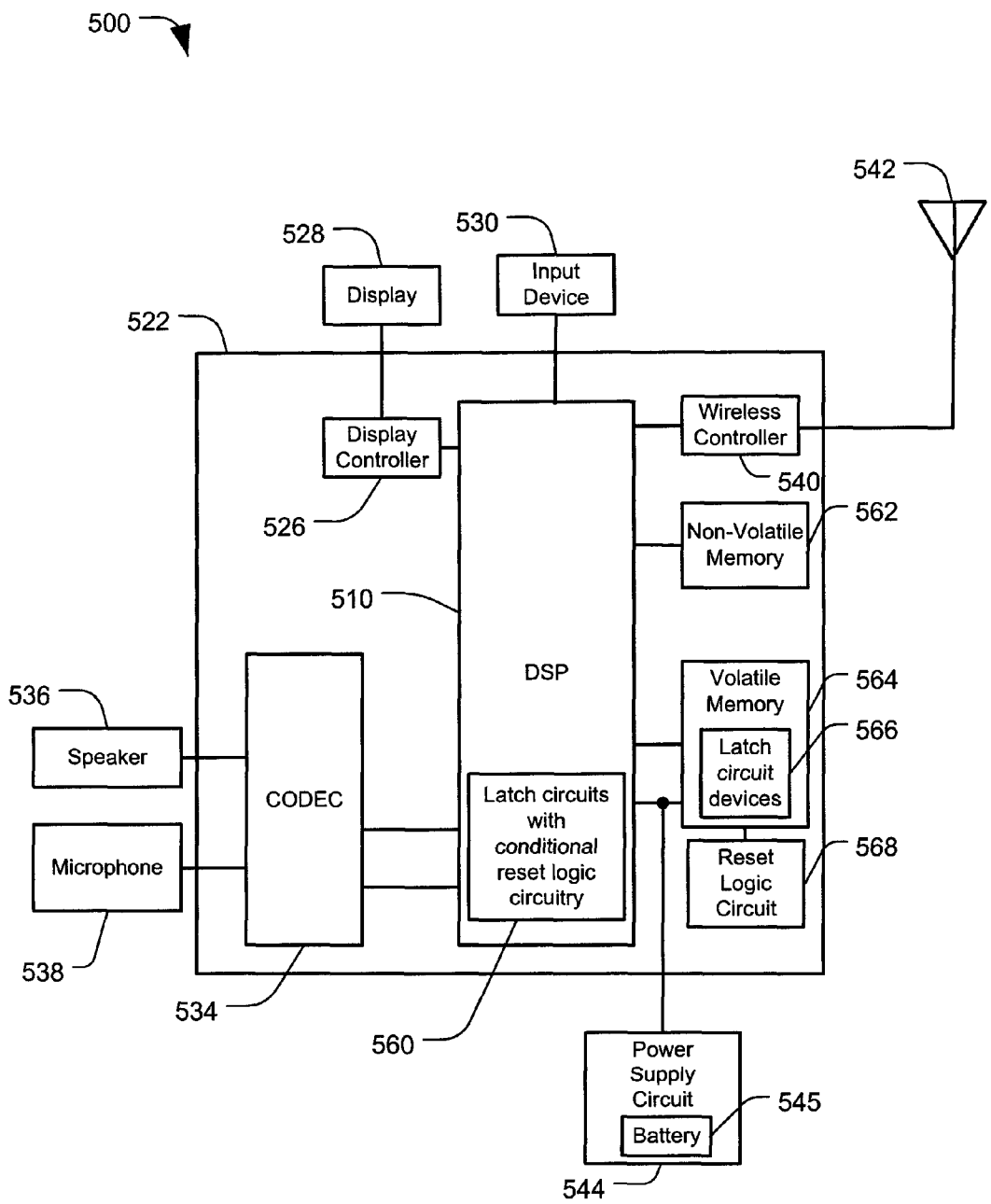
FIG. 5 is a block diagram of an illustrative embodiment of a wireless communications device including a circuit device with conditional reset control logic circuitry to conditionally reset a plurality of latch circuits.

Referring to FIG. 5, a wireless communication device including a circuit device with conditional reset control logic circuitry to conditionally reset a plurality of latches is depicted and generally designated 500. The wireless communications device 500 includes an on-chip system 522 that includes a processor, such as the digital signal processor 510, a general-purpose processor, other types of processors, or any combination thereof. The communication device 500 also includes a non-volatile memory 562 and a volatile memory 564. The digital signal processor (DSP) 510 includes latch circuits with conditional reset logic circuitry 560, such as the latch circuits and conditional reset logic circuits illustrated in FIGS. 1-3. In addition, the volatile memory 564 includes a plurality of latch circuit devices 566. A reset logic circuit 568 is coupled to the volatile memory 564 and responsive to feedback from the plurality of latch circuit devices 566 to selectively set some, but not all, of the latch circuit devices 566. In a particular embodiment, the reset logic circuit 568 may be included in the volatile memory 564, included in the DSP 510, or integrated with the latch circuit devices 566.

The communication device 500 includes a power supply circuit 544 with a battery 545. The power supply circuit 544 is coupled to the on-chip system 522, including the DSP 510 and the volatile memory 564. In addition, the power supply circuit 544 may also be coupled to other components of the communication device 500.

FIG. 5 also shows a display controller 526 that is coupled to the digital signal processor 510 and to a display 528. Moreover, an input device 530 is coupled to the digital signal processor 510. A coder/decoder (CODEC) 534 can also be coupled to the digital signal processor 510. A speaker 536 and a microphone 538 can be coupled to the CODEC 534.

FIG. 5 also indicates that a wireless controller 540 can be coupled to the digital signal processor 510 and to a wireless antenna 542. Moreover, as illustrated in FIG. 5, the display 528, the input device 530, the speaker 536, the microphone 538, the wireless antenna 542, and the power supply 544 can be external to the on-chip system 522. However, each is coupled to a component of the on-chip system 522.

The latch circuits with conditional reset logic circuitry 560 may include a plurality of latch circuits that are selectively reset based on a conditional reset logic circuit. Similarly, the latch circuit devices 566 may be selectively reset based on conditional logic implemented in the reset logic circuit 568. Such subsystems may be implemented as shown with respect to the systems and devices of FIGS. 1-3, the method of FIG. 4, or any combination thereof. While the latch circuitry with conditional reset logic circuitry 560 is shown as disposed within the DSP 510, it should be understood that the latch circuits with conditional reset logic circuitry 560 may be disposed in other components of the communication device 500, such as within the CODEC 534, within the non-volatile memory 562, within the volatile memory 564, within the wireless controller 540, within other components, or any combination thereof.

In a particular illustrative embodiment, the latch circuits with conditional reset logic circuitry 560 is adapted to selectively reset some, but not all, of the latch circuits in response to receiving a reset enable signal. The latch circuits with conditional reset logic circuitry 560 reduces overall power consumption by the wireless communications device 500 by reducing a number of latch circuit devices that switch in response to a reset signal. Additionally, the latch circuits with conditional reset logic circuitry 560 reduces overall power supply noise by reducing a number of devices that contribute to the power supply noise via the reset operations.

In a particular illustrative embodiment, the reset logic circuit 568 is adapted to selectively reset some, but not all, of the latch circuit devices 566 in response to receiving a reset enable signal. The reset logic circuit 568 may reduce overall power consumption by the wireless communications device 500 by reducing a number of the latch circuit devices 566 that switch in response to a reset signal. Additionally, overall power supply noise may be reduced by reducing a number of the latch circuit devices 566 that contribute to the power supply noise via the reset operations.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A circuit device comprising:
    a first latch including a first latch output;
    a second latch including a second latch output;
    a first feedback path coupled to the first latch output;
    a second feedback path coupled to the second latch output;
    a first input to receive a reset control signal; and
    a logic circuit adapted to, in response to receiving the reset control signal at the first input:
        conditionally reset the first latch based on the first feedback path; and
        conditionally reset the second latch based on the second feedback path.

2. The circuit device of claim 1, wherein the logic circuit resets the first latch when a state of the first latch output represents a value of one and does not reset the first latch when the state of the first latch output represents a zero value, and wherein the logic circuit resets the second latch when a state of the second latch output represents a value of one and does not reset the second latch when the state of the second latch output represents a zero value.

3. The circuit device of claim 1, wherein the logic circuit comprises:
    a control circuit including a NAND gate, one or more inverters, and an OR gate; and
    a transistor including a gate terminal coupled to an output of the OR gate and responsive to the control circuit to reset the first latch and the second latch to a known state.

4. The circuit device of claim 3, wherein the NAND gate includes a first input responsive to the reset control signal and a second input responsive to the first latch output and to the second latch output.

5. The circuit device of claim 1, wherein the first latch and the latch each comprise an asynchronous latch device.

6. The circuit device of claim 1, wherein the logic circuit is adapted to reset the first latch when the first latch output represents a state value other than a reset state value, and wherein the logic circuit is adapted to reset the second latch when the second latch output represents a state value other than the reset state value.

7. A method comprising:
    receiving a reset signal indicating a reset operation for a plurality of latches;
    detecting a state value associated with each of the plurality of latches; and
    in response to the reset signal, selectively resetting some, but not all, of the plurality of latches based on the detected state values;
    receiving a second reset signal;
    detecting a second state value associated with each of the plurality of latches; and
    in response to receiving the second reset signal, selectively resetting some, but not all, of the plurality of latches based on the detected second state values.

8. The method of claim 7, wherein each of the plurality of latches is coupled to a power supply and wherein the reset operation is associated with corresponding power supply noise.

9. The method of claim 8, wherein selectively resetting some, but not all of the plurality of latches reduces the corresponding power supply noise.

10. The method of claim 7, wherein selectively resetting some, but not all, of the plurality of latches comprises selectively enabling a reset signal to selected latches, the selected latches including some, but not all, of the plurality of latches.

11. The method of claim 10, wherein the selected latches include latches having an output value that is different from a reset value.

12. A circuit device comprising:
    a plurality of latch circuits adapted to store data, each of the plurality of latch circuits including a latch output;
    a plurality of feedback paths, each of the plurality of feedback paths coupled to a respective latch output associated with a respective one of the plurality of latch circuits; and
    a logic circuit responsive to each of the plurality of feedback paths, the logic circuit adapted to selectively reset one or more of the plurality of latch circuits responsive to values provided by the plurality of feedback paths.

13. The circuit device of claim 12, wherein the logic circuit is adapted to determine an output value of each of the plurality of latch circuits and to conditionally reset the one or more of the plurality of latch circuits based on the determined output values.

14. The circuit device of claim 12, wherein the logic circuit comprises a plurality of logic circuits, and wherein each of the plurality of logic circuits is coupled to a reset input of a corresponding latch of the plurality of latches.

15. The circuit device of claim 14, wherein each logic circuit of the plurality of logic circuits comprises a first input to receive a reset signal and a second input coupled to a respective feedback path.

16. The circuit device of claim 12, wherein the logic circuit includes at least one logic gate coupled to a respective feedback path of the plurality of feedback paths, the logic circuit coupled to at least one switch device coupled to each of the plurality of latch circuits, wherein the logic gate is adapted to conditionally activate the at least one switch when a value at the respective feedback path indicates a non-reset value.

17. A communications device comprising:
a digital signal processor;
a volatile memory coupled to the digital signal processor and including a plurality of latch circuit devices; and
a reset logic circuit coupled to the volatile memory and responsive to feedback from the plurality of latch circuit devices to selectively reset some, but not all, of the latch circuit devices.

18. The communications device of claim 17, wherein the volatile memory is responsive to the digital signal processor to store data.

19. The communications device of claim 17, further comprising a wireless transceiver coupled to the digital signal processor and adapted to communicate wirelessly with a communications network.

20. The communications device of claim 17, further comprising a power supply circuit comprising a battery coupled to the digital signal processor and to the volatile memory, wherein the reset logic circuit is adapted to reduce overall power consumption by the volatile memory.

21. The communications device of claim 17, wherein the feedback comprises a value at an output of each of the plurality of latch circuit devices.

22. A circuit device comprising:
means for receiving a reset signal indicating a reset operation for a plurality of latches;
means for detecting a state value associated with each of the plurality of latches;
means for selectively resetting some, but not all, of the plurality of latches based on the detected state values in response to receiving the reset signal;
means for detecting a second state value associated with each of the plurality of latches; and
means for selectively resetting some, but not all, of the plurality of latches based on the detected second state values.

23. The circuit device of claim 22, wherein the means for selectively resetting some, but not all, of the plurality of latches comprises means for selectively enabling a reset signal to selected latches of the plurality of latches.

24. The circuit device of claim 22, wherein the means for selectively resetting some, but not all, of the plurality of latches reduces power supply noise.

25. The circuit device of claim 22, wherein the means for delaying the resetting of the plurality of latches includes one or more inverters.

* * * * *